United States Patent
Choi et al.

(10) Patent No.: US 10,496,142 B2
(45) Date of Patent: Dec. 3, 2019

(54) ELECTRONIC DEVICE HAVING POWER DEVICE AND POWER CONTROL METHOD THEREOF

(71) Applicant: SAMSUNG ELECTRONICS CO., LTD., Suwon-si, Gyeonggi-do (KR)

(72) Inventors: Young-ho Choi, Suwon-si (KR); Seung-hoon Lee, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 72 days.

(21) Appl. No.: 15/326,174

(22) PCT Filed: Oct. 14, 2015

(86) PCT No.: PCT/KR2015/010817
§ 371 (c)(1),
(2) Date: Jan. 13, 2017

(87) PCT Pub. No.: WO2016/060457
PCT Pub. Date: Apr. 21, 2016

(65) Prior Publication Data
US 2017/0205859 A1    Jul. 20, 2017

(30) Foreign Application Priority Data
Oct. 14, 2014  (KR) .................. 10-2014-0138563

(51) Int. Cl.
*G06F 1/32*    (2019.01)
*G06F 1/20*    (2006.01)
(Continued)

(52) U.S. Cl.
CPC ............ *G06F 1/206* (2013.01); *G01R 21/133* (2013.01); *G06F 1/203* (2013.01); *G06F 1/28* (2013.01);
(Continued)

(58) Field of Classification Search
CPC ........ G06F 1/324; G06F 1/3296; Y02D 10/43
See application file for complete search history.

(56) References Cited

U.S. PATENT DOCUMENTS 7,941,650 B2    5/2011  Kim et al.
8,595,527 B2    11/2013  Chung et al.
(Continued)

FOREIGN PATENT DOCUMENTS

JP    2008-234638    10/2008
JP    5293289    9/2013
(Continued)

OTHER PUBLICATIONS

International Search Report for PCT/KR2015/010817, dated Jan. 26, 2016, 6 pages.
(Continued)

*Primary Examiner* — Albert Wang
(74) *Attorney, Agent, or Firm* — Nixon & Vanderhye, P.C.

(57) ABSTRACT

An electronic device is disclosed. The electronic device comprises: a dynamic voltage and frequency scaling (DVFS) unit for measuring the usage of an application processor (AP) corresponding to at least one function being executed and for controlling the voltage and operating frequency of the AP on the basis of the measured AP usage; and a control unit for controlling the DVFS unit not to control the voltage and operating frequency of the AP if said at least one function includes a preset function. Accordingly, if the preset function is executed, the response speed can be increased by not controlling the voltage and operating frequency of the AP.

9 Claims, 9 Drawing Sheets

(51) Int. Cl.
*G01R 21/133* (2006.01)
*G06F 1/28* (2006.01)
*G06F 1/324* (2019.01)
*G06F 1/3296* (2019.01)
*G06F 1/3212* (2019.01)

(52) U.S. Cl.
CPC ............ *G06F 1/324* (2013.01); *G06F 1/3296* (2013.01); *G06F 1/3212* (2013.01); *Y02D 10/126* (2018.01); *Y02D 10/172* (2018.01); *Y02D 10/174* (2018.01)

(56) References Cited

U.S. PATENT DOCUMENTS

| | | | |
|---|---|---|---|
| 8,689,037 | B2 | 4/2014 | Rychlik et al. |
| 2006/0123252 | A1 | 6/2006 | Vaidya et al. |
| 2008/0209238 | A1 | 8/2008 | Dolwin |
| 2009/0049314 | A1 | 2/2009 | Taha et al. |
| 2013/0290751 | A1* | 10/2013 | Mondal ................. G06F 1/3206 713/320 |
| 2013/0311801 | A1 | 11/2013 | Kong et al. |
| 2014/0068285 | A1 | 3/2014 | Lee et al. |
| 2014/0091624 | A1 | 4/2014 | Park et al. |
| 2014/0215253 | A1* | 7/2014 | Klassen ................ G06F 1/3206 713/340 |
| 2015/0261583 | A1* | 9/2015 | Vanka ...................... G06F 9/54 719/313 |

FOREIGN PATENT DOCUMENTS

| | | |
|---|---|---|
| KR | 10-2009-0043384 | 5/2009 |
| KR | 10-2011-0073631 | 6/2011 |
| KR | 10-2013-0114795 | 10/2013 |
| KR | 10-2013-0127746 | 11/2013 |
| KR | 10-2014-0002087 | 1/2014 |
| KR | 10-2014-0029721 | 3/2014 |
| KR | 10-2014-0042979 | 4/2014 |
| KR | 10-1427526 | 8/2014 |

OTHER PUBLICATIONS

Written Opinion of the ISA for PCT/KR2015/010817, dated Jan. 26, 2016, 14 pages.
Extended Search Report dated Feb. 27, 2018 in counterpart European Patent Application No. 15851128.7.
Communication pursuant to Article 94(3) EPC dated Feb. 7, 2019 in counterpart European Patent Application No. 15851128.7.

* cited by examiner

ELECTRONIC DEVICE HAVING POWER DEVICE AND POWER CONTROL METHOD THEREOF

This application is the U.S. national phase of International Application No. PCT/KR2015/010817 filed 14 Oct. 2015, which designated the U.S. and claims priority to KR Patent Application No. 10-2014-0138563 filed 14 Oct. 2014, the entire contents of each of which are hereby incorporated by reference.

TECHNICAL FIELD

The present general inventive concept generally relates to an electronic device and a method for controlling the same, and more particularly, to an electronic device that adjusts a voltage and an operating frequency of an Application Processor (AP) and a method for controlling the same.

BACKGROUND OF THE INVENTION

With the development of electronic technologies, various types of electronic devices have been developed and have come into wide use. Specially, diverse electronic devices, such as, a television (TV), a mobile phone, a Personal Computer (PC), a laptop PC, a Personal Digital Assistant (PDA), or the like, are widely used in many households.

In order to run a variety of applications, such electronic devices employ a high-end AP, an increased Double Data Rate (DDR), and a Graphic Processing Unit (GPU) for improving usability and performance.

The high-end AP, the high-capacity DDR, and the GPU have increased a processing speed of the AP, causing a heating problem and a standby power problem. As a solution to the problems, a Dynamic Voltage and Frequency Scaling (DVFS) method is applied. The DVFS method decreases a voltage and an operating frequency of an AP dynamically in response to usage of the AP being lower than a certain threshold value for a certain period.

However, a user may wish to execute a particular function by pressing a button on a remote controller of a TV or on a mobile phone while the voltage and the operating frequency of the AP have been decreased by the DVFS method based on the low usage of the AP. In this case, the particular function may be executed after an additional voltage is supplied to the AP, and the operating frequency of the AP is increased.

In this case, as illustrated in FIG. 1, a time interval (T) occurs between a point of time when the user manipulates the button to execute the particular function and a point of time when the particular function is executed actually. Accordingly, the user may believe that a system has a slow reaction speed or poor performance and may be dissatisfied with the system.

DETAILED DESCRIPTION OF THE INVENTION

Technical Purpose

The present disclosure has been provided to address the aforementioned and other problems and disadvantages occurring in the related art, and an aspect of the present disclosure provides an electronic device for increasing an execution speed of a preset function and a method for controlling the same.

Means for Solving Problems

According to an embodiment of the present disclosure, there is provided an electronic device. The device includes a Dynamic Voltage and Frequency Scaling (DVFS) unit configured to measure usage of an Application Processor (AP) corresponding to at least one function being executed and adjust a voltage and an operating frequency of the AP based on the measured usage of the AP and a control unit configured to, in response to the at least one function including a preset function, control the DVFS unit so as not to adjust the voltage and the operating frequency of the AP.

In response to the at least one function including the preset function, the control unit may control the DVFS unit so as not to adjust the voltage and the operating frequency of the AP based on a signal for avoiding adjustment of the voltage and the operating frequency of the AP.

The preset function may be provided by a preset application. Further, the control unit may receive the signal for avoiding adjustment of the voltage and the operating frequency of the AP from the preset application and control the DVFS unit so as not to adjust the voltage and the operating frequency of the AP based on the received signal.

The device may further include a status determining unit configured to determine a heating status and a battery status of the electronic device. Further, the control unit may control the DVFS unit so as to adjust the voltage and the operating frequency of the AP based on the heating status and the battery status of the electronic device although the signal for avoiding adjustment of the voltage and the operating frequency of the AP is received.

The AP may include a plurality of cores. Further, the control unit may control the DVFS unit so as not to adjust a voltage and an operating frequency of a core where the preset function is executed and control so as to adjust voltages and operating frequencies of the other cores.

In response to the usage of the AP being higher than a predetermined upper threshold, the DVFS unit may increase the voltage and the operating frequency of the AP, and in response to the usage of the AP being lower than a predetermined lower threshold, the DVFS unit may decrease the voltage and the operating frequency of the AP.

In response to the usage of the AP being lower than the predetermined upper threshold and higher than the predetermined lower threshold, the DVFS unit may do not adjust the voltage and the operating frequency of the AP.

The preset function may be a function set by default in a manufacturing process or selected by a user.

According to an embodiment of the present disclosure, there is provided a method for controlling an electronic device. The method includes measuring usage of an Application Processor (AP) corresponding to at least one function being executed, adjusting a voltage and an operating frequency of the AP based on the measured usage of the AP, and controlling, in response to the at least one function including a preset function, so as not to adjust the voltage and the operating frequency of the AP.

In response to the at least one function including the preset function, the controlling may include controlling so as not to adjust the voltage and the operating frequency of the AP based on a signal for avoiding adjustment of the voltage and the operating frequency of the AP.

The preset function may be provided by a preset application. Further, the controlling may include receiving the signal for avoiding adjustment of the voltage and the operating frequency of the AP from the preset application and controlling so as not to adjust the voltage and the operating frequency of the AP based on the received signal.

The method may further include determining a heating status and a battery status of the electronic device. Further, the controlling may include controlling so as to adjust the voltage and the operating frequency of the AP based on the heating status and the battery status of the electronic device although the signal for avoiding adjustment of the voltage and the operating frequency of the AP is received.

The AP may include a plurality of cores. Further, the controlling may include controlling so as not to adjust a voltage and an operating frequency of a core where the preset function is executed and controlling so as to adjust voltages and operating frequencies of the other cores.

In response to the usage of the AP being higher than a predetermined upper threshold, the adjusting may include increasing the voltage and the operating frequency of the AP, and in response to the usage of the AP being lower than a predetermined lower threshold, decreasing the voltage and the operating frequency of the AP.

In response to the usage of the AP being lower than the predetermined upper threshold and higher than the predetermined lower threshold, the adjusting may include not adjusting the voltage and the operating frequency of the AP.

The preset function may be a function set by default in a manufacturing process or selected by a user.

Effects of the Invention

According to the above-described various embodiments of the present disclosure, the electronic device may increase a reaction speed by not adjusting the voltage and the operating frequency of the AP when the preset function is executed.

DETAILED DESCRIPTION OF PREFERRED EMBODIMENT

Figure 1:
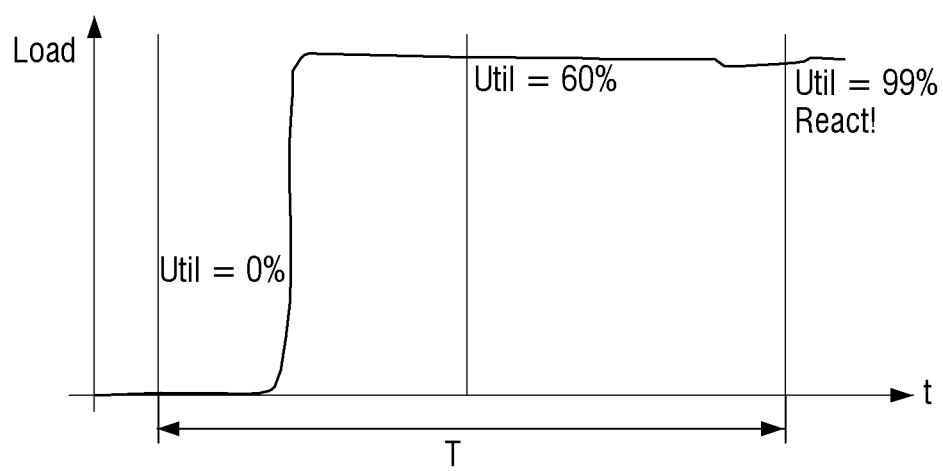
FIG. 1 is a diagram provided to describe the related art.

Certain embodiments are described below in greater detail with reference to the accompanying drawings. In the following description, like drawing reference numerals are used for the like elements, even in different drawings. The matters defined in the description, such as detailed construction and elements, are provided to assist in a comprehensive understanding of embodiments. However, embodiments can be practiced without those specifically defined matters. Also, well-known functions or constructions are not described in detail since they would obscure the application with unnecessary detail. The terms used in the following description are expressions defined by considering functions in the present disclosure and may vary depending upon an intention of a person having ordinary skill in the art (hereinafter referred to as 'those skilled in the art') or relations thereof. Accordingly, the terms used in the present disclosure should be defined based on overall descriptions of the present disclosure.

Figure 2:
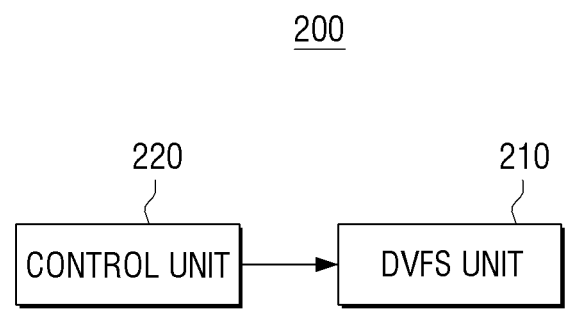
FIG. 2 is a block diagram illustrating a configuration of an electronic device according to an embodiment disclosed herein.

FIG. 2 is a block diagram illustrating a configuration of an electronic device according to an embodiment disclosed herein.

Referring to FIG. 2, an electronic device 200 includes a Dynamic Voltage and Frequency Scaling (DVFS) unit 210 and a control unit 220. In this case, the electronic device 200 may include all kinds of electronic devices using an Application Processor (AP), such as, a Television (TV), an electronic bulletin board, an electronic table, a Large Format Display (LFD), a smart phone, a tablet PC, a desktop PC, a laptop PC, or the like.

The DVFS unit 210 measures usage of an AP corresponding to at least one function being executed and adjusts a voltage and an operating frequency of the AP based on the measured usage of the AP. To be specific, in response to many jobs being executed by the AP, the usage of the AP increases. Accordingly, the DVFS unit 210 needs to increase the operating frequency of the AP and supply a higher voltage to the AP. In response to not many jobs being executed by the AP, the usage of the AP decreases. Accordingly, the DVFS unit 210 needs to decrease the operating frequency of the AP and supply a lower voltage to the AP.

The following descriptions will be provided on the assumption that the electronic device 200 according to an embodiment disclosed herein is a mobile device, and a processor installed in the electronic device 200 is an AP.

However, the processor includes a Central Processing Unit (CPU) as well as the AP. Accordingly, in response to the electronic device 200 according to an embodiment disclosed herein being realized as a desktop PC or a laptop PC, the processor may be realized as a CPU, needless to say. In addition, operations of the DVFS unit 210 and the control unit 220 may apply to both the AP and the CPU. The operations of the DVFS unit 210 and the control unit 220 will be described below in detail.

Hereinafter, the operations of the DVFS unit 210 will be described in greater detail. The DVFS method was developed to overcome a problem where it is unable to reduce power consumption while an electronic device or components thereof are in operation. For example, every job executed in a computer does not require the best performance of the CPU, and a user may want a longer battery life rather than a faster processing speed. That is, the aim of the DVFS method is to acquire gains in the power consumption instead of reducing an operating speed of the electronic device or the components thereof.

Specially, the DVFS method is usually employed in a CPU since the power consumption of the CPU is significantly greater than the power consumption of other components affecting the performance. By way of example, a Linux-based system realizes the DVFS method only through the CPU. The DVFS method used in the Linux-based system decreases the operating frequency of the CPU thereby reducing the power consumption. That is, the power consumption is reduced by decreasing the operating frequency of the CPU, which may be expressed as Equation 1 and Equation 2 as shown below:

Equation 1

$$E = E_{STATIC} + E_{DYNAMIC} + E_{SHORT}$$ [Formula 1]

In Equation 1, $E_{STATIC}$ refers to energy consumed by bias currents and leakage currents of a Complementary Metal-Oxide Semiconductor (CMOS) circuit, $E_{dynamic}$ refers to energy consumed as electric charges are charged into or discharged from a capacitor, and $E_{SHORT}$ refers to energy consumed when P-type Metal-Oxide Semiconductor (PMOS) and N-type Metal-Oxide Semiconductor (NMOS) of CMOS are turned on at the same time. In a common CPU structure, $E_{DYNAMIC}$ is the most influential as compared with $E_{STATIC}$ and $E_{SHORT}$. Accordingly, Equation 1 may be approximated as shown below:

Equation 2

$$E \approx E_{DYNAMIC} = C*f*V^{2}*t$$ [Formula 2]

In Equation 2, f refers to a frequency, V refers to a voltage supplied to elements, and t refers to an operating time. In this case, V is directly proportional to f and t is inversely proportional to f. Accordingly, the energy consumed in the AP is directly proportional to square of the frequency.

Accordingly, the consumed energy may be saved by a great amount by decreasing the operating frequency of the CPU by a small amount. For instance, in response to the operating frequency of the CPU 20% decreasing from 200 Mhz to 161 Mhz, the power consumption is reduced by 44%, which results in 30% energy saving.

Figure 3:
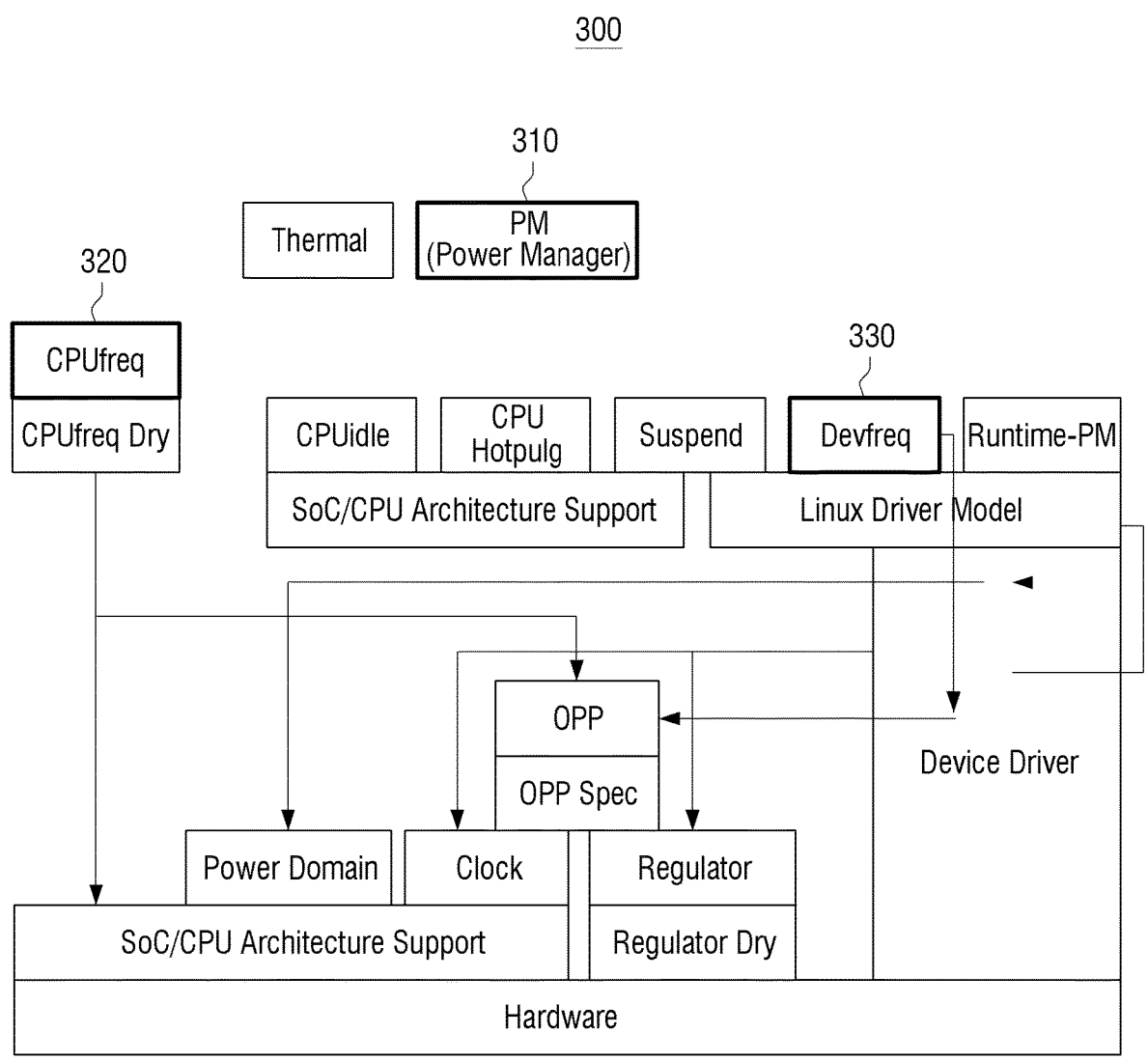
FIGS. 3 and 4 are diagrams provided to describe a DVFS method realized in a Linux-based system.
Figure 4:
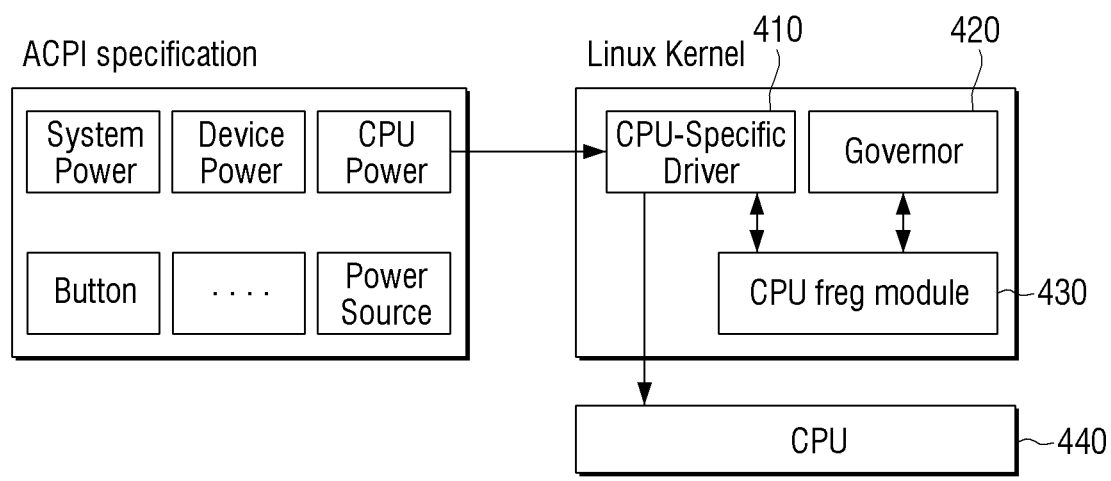

Meanwhile, the DVFS unit 210 according to an embodiment disclosed herein may be realized in the Linux-based system as illustrated in FIGS. 3 and 4.

FIGS. 3 and 4 are diagrams provided to describe a DVFS method realized in a Linux-based system.

FIG. 3 shows a configuration for a common power on/off operation in a Linux Operating System (OS). Main components of the configuration are a Power Manager (PM) 310, a CPU freq 320, and a Dev freq 330.

The PM 310 performs a critical role in power management of the Linux OS. The CPU freq 320 is a module for dynamically (run-time) converting the operating frequency of the CPU. The Dev freq 330 converts operating frequencies of diverse devices dynamically (run-time).

According to an embodiment disclosed, the DVFS unit 210 may include entire components of FIG. 3.

The principle of the DVFS method will be described in further detail with reference to FIG. 4. Referring to FIG. 4, the DVFS method may be realized by roughly being divided into three parts of a CPU specific Driver 410, a Governor 420, and a CPU freq module 430. The CPU specific Driver 410 changes the operating frequency of a CPU 440 directly, the Governor 420 determines when to and how much to change the operating frequency of the CPU 440, and the CPU freq module 430 is a common interface that supports the CPU specific Driver 410 and the Governor 420 so as to be developed individually.

The CPU specific Driver 410 may be realized according to a power status of the CPU that controls the DVFS in an ACPI specification.

The Governor 420 changes the operating frequency of the CPU 440 indirectly through the CPU freq module 430 and have information on circumstances for changing the operating frequency and an amount of the change. The Linux-based system may realize various kinds of the Governor 420 and support the Governor 420 so as to be changed properly depending upon user requests. The Governor 420 that is commonly used in the Linux-based system may include a Performance Governor, a Powersave Governor, a Ondemend Governor, a Conservative Governor, and a Userspace Governor.

The Performance Governor configures the CPU 440 so as to use the best possible operating frequency. Accordingly, the Performance Governor does not provide a function for reducing the power consumption and is commonly used in a device directly connected to a power source, for example, a desktop computer. Further, the Performance Governor is suitable for cases where the CPU 440 does not enter into an idle state.

The Powersave Governor configures the CPU 440 so as to use the lowest possible frequency. The Powersave Governor reduces the power consumption to the greatest extent by operating in a contrary manner to the Performance Governor, which leads to the poorest performance of the CPU 440.

The Ondemend Governor is a representative Governor to which the general DVFS concept applies. In response to the usage of the AP being higher than an upper threshold, the Ondemend Governor uses a maximum operating frequency. In response to the usage of the AP being lower than a lower threshold, the Ondemend Governor decreases the operating frequency gradually.

The Conservative Governor is implemented with slight variations from the configuration of the Ondemend Governor. The Conservative Governor is distinct from the Ondemend Governor in that the Conservative Governor increases the operating frequency gradually in response to the usage of the CPU being higher than the upper threshold.

The Performance Governor, the Powersave Governor, the Ondemend Governor, and the Conservative Governor operate in such a way that the OS changes the operating frequency of the AP autonomously. By contrast, the Userspace Governor operates by a program configured by a user or a program configurable by a user, which is to enable the user or the program to change the operating frequency of the CPU 440 arbitrarily.

The DVFS method used in the above-described Linux-based system applies to the DVFS unit 210 according to an embodiment disclosed herein in the same manner. Accordingly, the DVFS unit 210 may measure the usage of the AP and adjust the voltage and the operating frequency of the AP based on the measured usage of the AP.

In the above embodiment, the DVFS method used in the Linux-based system of FIGS. 3 and 4 is to control the CPU, but the DVFS method may be used to control the AP, that is, a processor in a mobile device, in the same manner.

Referring back to FIG. 2, in response to the at least one function being executed including a preset function, that is, in response to the preset function being executed, the control unit 220 may control the DVFS unit 210 so as not to adjust the voltage and the operating frequency of the AP.

In other words, in response to at least one function being executed as the AP in the electronic device 200 performs a job, the DVFS unit 210 measures the usage of AP and adjusts the voltage and the operating frequency of the AP based on the measured usage of the AP. In response to the at least one executed function including the preset function and the preset function being executed, the control unit 220 may control the DVFS unit 210 so as not to adjust the voltage and the operating frequency of the AP.

As an example, it is assumed that the electronic device 200 is a remote controller with function keys, a volume up/down function of a display device is mapped onto a function key of the remote controller, and the volume up/down function is executed as the function key is manipulated by a user. In this case, the DVFS unit 210 measures the usage of AP and adjusts the voltage and the operating frequency of the AP based on the measured usage of the AP. As another example, it is assumed that a function of returning to a previous screen is registered as the preset function according to the need to be processed without delay, and the function is mapped onto a function key of the remote controller. In response to the function being executed as the corresponding function key is manipulated by the user, the control unit 210 may control the DVFS unit 210 so as not to adjust the voltage and the operating frequency of the AP in order to reduce a delay between a point of time when the user manipulates the function key and a point of time when a screen returns to the previous screen.

Accordingly, the control unit 220 may control the function of returning to the previous function to be executed in the AP by the user manipulation without adjusting the voltage and the operating frequency of the AP.

In other words, in executing the preset function, the control unit 220 may control the DVFS unit 210 so as to skip the process of adjusting the voltage and the operating frequency of the AP in order to reduce a time consumed for the adjustment.

In response to the at least one function including the preset function, the control unit 220 may control the DVFS unit 210 so as not to adjust the voltage and the operating frequency of the AP based on a signal for avoiding adjustment of the voltage and the operating frequency of the AP.

To be specific, the preset function may be provided by a preset application. In response to the at least one function including the preset function, the control unit 220 may receive the signal for avoiding adjustment of the voltage and the operating frequency of the AP from the preset application and control the DVFS unit 210 so as to adjust the voltage and the operating frequency of the AP based on the received signal.

For example, it is assumed that a flash function is registered as the preset function according to the need to be executed quickly without delay, and an application for providing the flash function is installed in a smart phone. In response to the flash function being executed as the application for providing the flash function runs by the user manipulation, the application may transmit a request signal for avoiding the adjustment of the voltage and the operating frequency of the AP to the control unit 220. The control unit 220 may control the DVFS unit 210 so as not to adjust the voltage and the operating frequency of the AP based on the received signal.

The preset function may be set by default in a manufacturing process or selected by the user.

As an example, the preset function may be the function of returning to the previous screen. In this case, the remote controller may be preset in the manufacturing process such that the control unit 220 controls the DVFS unit 210 so as not to adjust the voltage and the operating frequency of the AP in response to execution of the function of returning to the previous screen. As another example, the preset function may be the flash function. In this case, the application for providing the flash function may be set by a developer in a design process such that the application transmits the signal for avoiding the adjustment of the voltage and the operating frequency of the AP to the control unit 220 in response to execution of the flash function.

Meanwhile, although the preset function has not been set by default in the manufacturing process, a function selected by the user manipulation may be set as the preset function.

By way of example, an emergency-call application provides a function of automatically making a call in an emergency. Although the function was not set as the preset function in a development stage, the user may select and set the function as the preset function.

That is, the user may select the emergency-call application and set the application to be in an operating mode 'Quick launch.' In response to the emergency-call application running by the user manipulation, and the function of automatically making a call being executed, the emergency-call application may transmit the signal for avoiding adjustment of the voltage and the operating frequency of the AP to the control unit 220. Subsequently, the control unit 220 may control the DVFS unit 210 so as not to adjust the voltage and the operating frequency of the AP based on the received signal.

Figure 5:
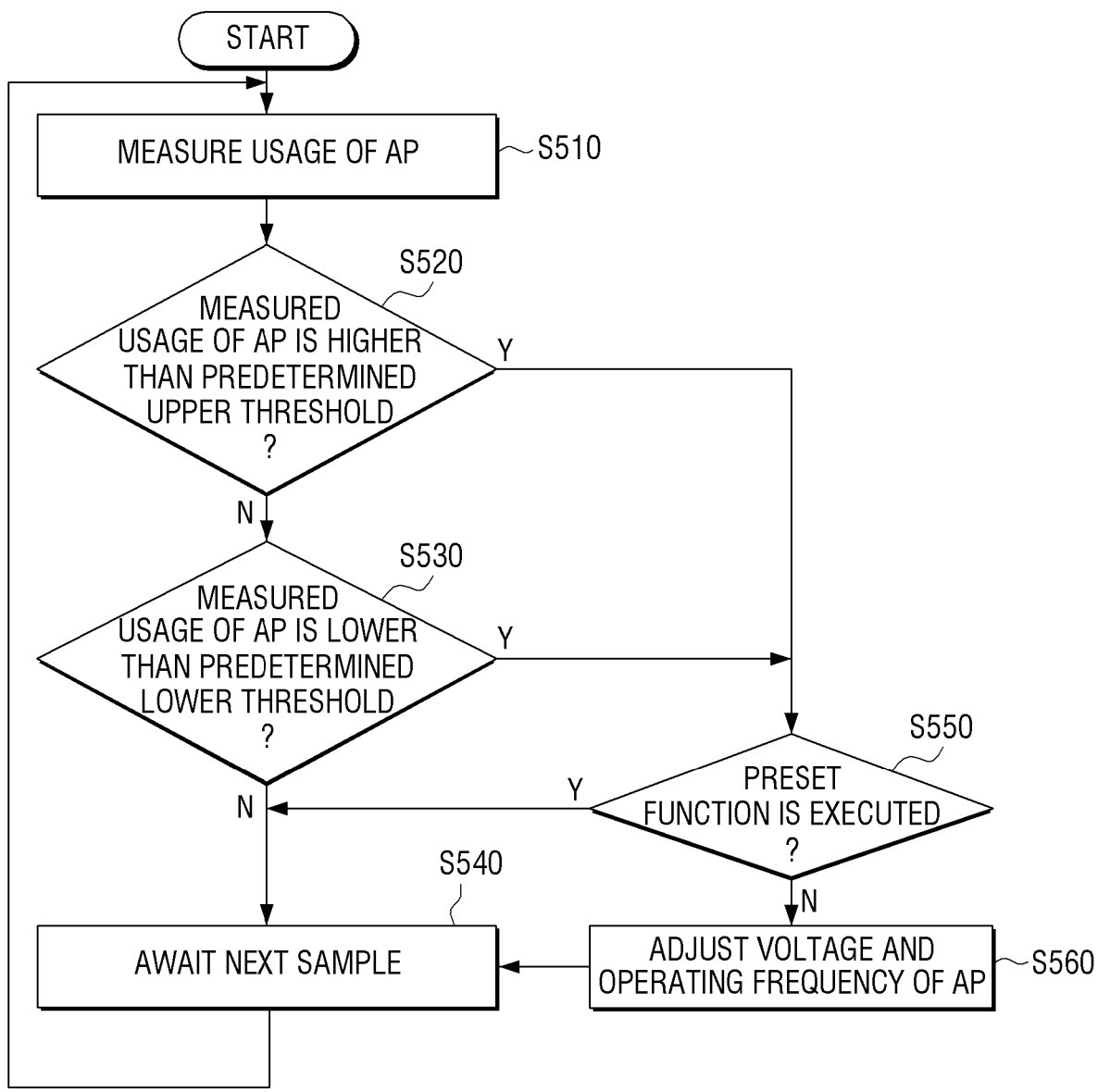
FIG. 5 is a flowchart provided to describe a process executed by a DVFS unit 210 and a control unit 220 according to an embodiment disclosed herein.

The process of the DVFS unit 210 and the control unit 220 may be illustrated as a flowchart of FIG. 5.

FIG. 5 is a flowchart provided to describe a process executed by the DVFS unit 210 and the control unit 220 according to an embodiment disclosed herein.

Referring to FIG. 5, the DVFS unit 210 measures the usage of the AP corresponding to at least one function being executed (S510) and determines whether the measured usage of the AP is higher than the predetermined upper threshold (S520). In response to determining that the measured usage of the AP is not higher than the predetermined upper threshold, the DVFS unit 210 determines whether the measured usage of the AP is lower than the predetermined lower threshold (S530). In response to determining that the measured usage of the AP is not lower than the predetermined lower threshold, the DVFS unit 210 does not adjust the voltage and the operating frequency of the AP and awaits a next sample (S540).

In response to determining that the measured usage of the AP is higher than the predetermined upper threshold or lower than the predetermined lower threshold, the control unit 220 determines whether the at least one executed function includes the preset function. That is, the control unit 220 determines whether the preset function is executed (S550). In response to determining that the at least one executed function includes the preset function, that is, the preset function is executed, the control unit 220 controls the DVFS unit 210 so as not adjust the voltage and the operating frequency of the AP and so as to await a next sample (S540). In response to determining that the at least one executed function does not include the preset function, that is, the preset function is not executed, the control unit 220 may control the DVFS unit 210 so as to adjust the voltage and the operating frequency of the AP (S560). In other words, in response to determining that the preset function is not executed, the control unit 220 may control the DVFS unit 210 to operate normally.

Figure 6:
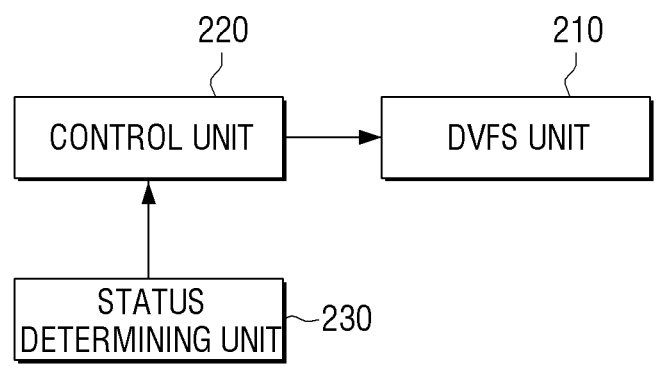
FIG. 6 is a block diagram illustrating a configuration of an electronic device according to another embodiment disclosed herein.

FIG. 6 is a block diagram illustrating a configuration of an electronic device according to another embodiment disclosed herein.

Referring to FIG. 6, an electronic device 200 includes a DVFS unit 210, a control unit 220, and a status determining unit 230. The DVFS unit 210 and the control unit 220 were described in the above embodiments, and thus, a detailed description is omitted.

The status determining unit 230 determines a heating status and a battery status of the electronic device 200. In response to at least one function including a preset function, the control unit 220 may control the DVFS unit 210 so as to adjust a voltage and an operating frequency of an AP based on the heating status and the battery status of the electronic device 200 although a signal for avoiding adjustment of the voltage and the operating frequency of the AP is received.

In other words, in response to a preset application that provides a preset function running, the control unit 220 may receive the signal for avoiding adjustment of the voltage and the operating frequency of the AP from the preset application. However, in response to determining that the heating status and the batter status of the electronic device 200 are bad by the status determining unit 230, that is, the electronic device 200 becomes hot or there is not enough battery, the control unit 220 may control the DVFS unit 210 so as to adjust the voltage and the operating frequency of the AP. In response to determining that the heating status and the batter status of the electronic device 200 are good by the status determining unit 230, the control unit 220 may control the DVFS unit 210 so as not to adjust the voltage and the operating frequency of the AP.

That is, the control unit 220 may determine whether to raise processing performance or reduce the power consumption based on an execution state of the preset function, the heating status and the battery status of the electronic device 200, or the like. Accordingly, the control unit 220 may control the DVFS unit 210 so as to or so as not to adjust the voltage and the operating frequency of the AP.

Figure 7:
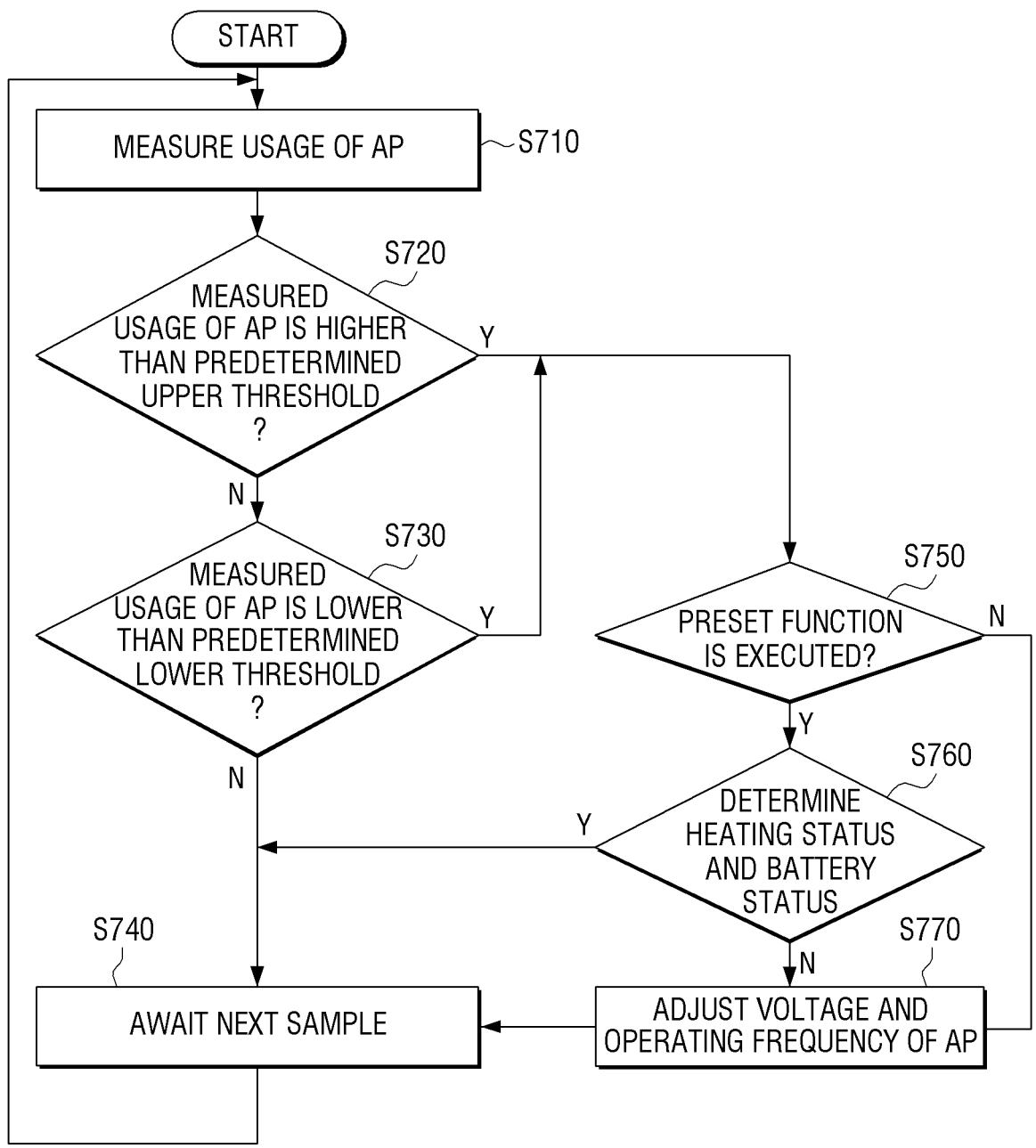
FIG. 7 is a flowchart provided to describe a process executed by an electronic device according to another embodiment disclosed herein.

FIG. 7 is a flowchart provided to describe a process executed by an electronic device according to another embodiment disclosed herein.

Referring to FIG. 7, a DVFS unit 210 measures usage of an AP corresponding to at least one function being executed (S710) and determines whether the measured usage of the AP is higher than the predetermined upper threshold (S720). In response to determining that the measured usage of the AP is not higher than the predetermined upper threshold, the DVFS unit 210 determines whether the measured usage of the AP is lower than the predetermined lower threshold (S730). In response to determining that the measured usage of the AP is not lower than the predetermined lower threshold, the DVFS unit 210 does not adjust the voltage and the operating frequency of the AP and awaits a next sample (S740).

In response to determining that the measured usage of the AP is higher than the predetermined upper threshold or lower than the predetermined lower threshold, the control unit 220 determines whether the at least one executed function includes a preset function, that is, whether the preset function is executed (S750). In response to determining that the at least one executed function includes the preset function, that is, the preset function is executed, the control unit 220 determines the heating status and the battery status of the electronic device (S760).

In response to determining that the heating status and the batter status of the electronic device 200 are good, the control unit 220 controls the DVFS unit 210 so as not to adjust the voltage and the operating frequency of the AP and awaits a next sample (S740).

In response to determining that the heating status and the batter status of the electronic device 200 are bad, the control unit 220 controls the DVFS unit 210 so as to adjust the voltage and the operating frequency of the AP (S770).

In response to determining that the at least one executed function does not include the preset function, that is, the preset function is not executed, the control unit 220 controls the DVFS unit 210 so as to adjust the voltage and the operating frequency of the AP (S770).

Meanwhile, the AP may include a plurality of cores. In this case, the DVFS unit 210 may adjust a voltage and an operating frequency of each of the plurality of cores. For example, in response to the AP being realized as a quad-core with four cores, the DVFS unit 210 may adjust the voltages and the operating frequencies of the cores, respectively.

To be specific, in response to the AP including the plurality of cores, and at least one executed function including the preset function, that is, the preset function being executed, the control unit 220 may control the DVFS unit 210 so not to adjust a voltage and an operating frequency of a core where the preset function is executed and so as to adjust the voltages and the operating frequencies of the other cores.

Figure 8:
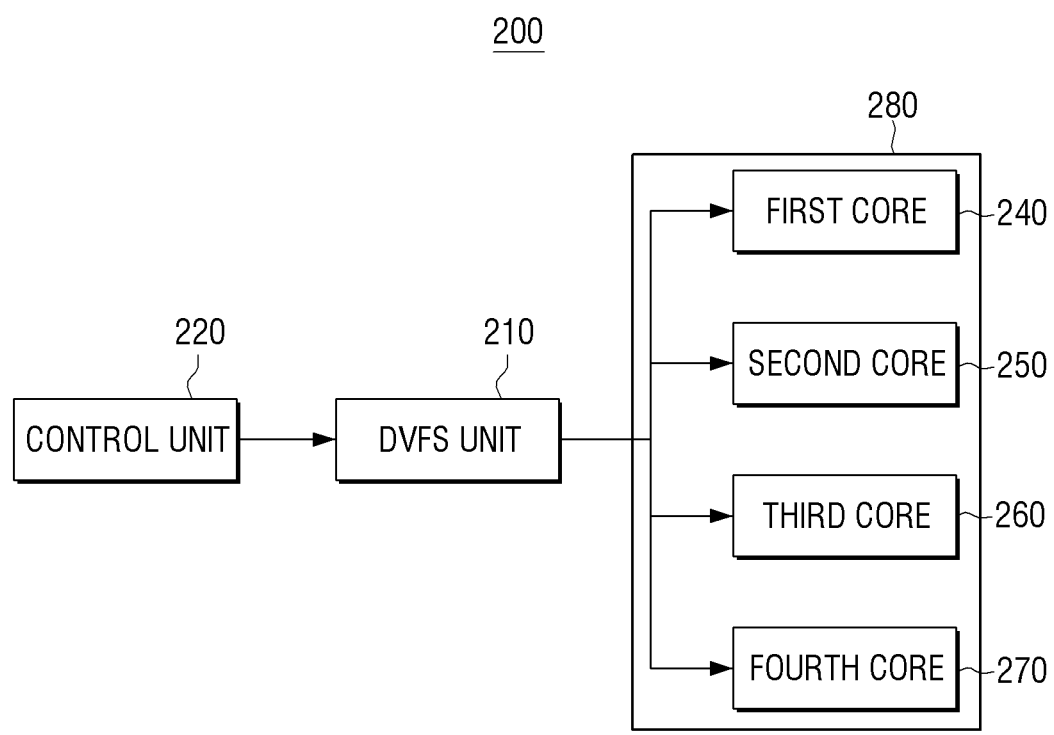
FIG. 8 is a diagram provided to describe a configuration for adjusting a voltage and an operating frequency when a plurality of cores are given according to an embodiment disclosed herein.

FIG. 8 is a diagram provided to describe a configuration for adjusting a voltage and an operating frequency when a plurality of core processors are given according to an embodiment disclosed herein.

Referring to FIG. 8, a DVFS unit 210 may adjust a voltage and an operating frequency of each of a first core 240, a second core 250, a third core 260, and a fourth core 270 included in an AP 280. The control unit 220 may control the DVFS unit 210 so as to adjust only the voltage and the operating frequency of a core where the preset function is executed.

As an example, it is assumed that an application for enabling a user to use internet, one of common functions that are not set as the preset function, runs in the first core 240, and the second core 250, the third core 260, the fourth core 270 execute other common functions. In this case, the DVFS unit 210 may adjust the voltage and the operating frequency of each of the first core 240, the second core 250, the third core 260, and the fourth core 270 thereby reducing the power consumption.

As another example, in response to a camera application for photographing images being set as the preset function and the camera application running in the first core 240, the control unit 220 may control the DVFS unit 210 so as not to adjust the voltage and the operating frequency of the first core 240 and so as to adjust the voltages and the operating frequencies of the second core 250, the third core 260, and the fourth core 270 without changes.

As still another example, in response to the function of returning to the previous channel being set as the preset function, and the function running in the first core 240 as a corresponding function key is manipulated by the user, the control unit 220 may control the DVFS unit 210 so as not to adjust the voltage and the operating frequency of the first core 240 and so as to adjust the voltages and the operating frequencies of the second core 250, the third core 260, and the fourth core 270 without changes.

The AP 280 in the above embodiment of FIG. 8 includes four cores, but this is only an example. The number of cores is not limited thereto and may increase or decrease.

Further, the adjustment of the DVFS unit 210 according to an embodiment disclosed herein with respect to the voltage and the operating frequency of the AP is performed on the premise that at least one function is executed while the AP is turned on. In response to an operation mode of the electronic device 200 being changed to a sleep mode, the AP is off. Accordingly, the DVFS unit 210 does not adjust the voltage and the operating frequency of the AP. That is, there is no power consumption once the AP is turned off, and thus, the DVFS unit 210 does not need to operate with the AP.

In response to functions provided by a plurality of applications being set as the preset function, and two or more of the functions being executed simultaneously or sequentially, the control unit 220 may determine whether the preset function is executed and control the DVFS unit 210 so as not to adjust the voltage and the operating frequency of the AP continuously while the preset function is executed. Further, in response to a plurality of APs being present, the control unit 220 may determine which AP executes the preset function and control the DVFS unit 210 so as not to adjust a voltage and an operating frequency of only at least one AP where the preset function is executed and so as to adjust voltages and operating frequencies of the other APs.

In the above embodiment, the control unit 220 and the AP are separate components, but the control unit 220 and the AP may be the same. Further, the control unit 220 may be realized as a component embedded in the AP, and vice versa.

In response to a common function that is not set as the preset function being executed, the DVFS unit 210 may perform a common function of adjusting the voltage and the operating frequency of the AP. To be specific, the DVFS unit 210 may increase the voltage and the operating frequency of the AP in response to the usage of the AP being higher than the predetermined upper threshold and decrease the voltage and the operating frequency of the AP in response to the usage of the AP being lower than the predetermined lower threshold.

By way of example, in response to a video playback function that is not set as the preset function being executed, the DVFS unit 210 measures the usage of the AP corresponding to the video playback function. In response to the measured usage of the AP being higher than the predetermined upper threshold, the DVFS unit 210 executes the video playback function requiring the greater amount of usage of the AP by increasing the voltage and the operating frequency of the AP.

In response to the measured usage of the AP being lower than the predetermined upper threshold, the DVFS unit 210 may execute the video playback function requiring the lesser amount of usage of the AP by decreasing the voltage and the operating frequency of the AP and reduce the power consumption.

In response to the common function that is not set as the preset function being executed, and the usage of the AP corresponding to the common function being lower than the predetermined upper threshold and higher than the predetermined lower threshold, the DVFS unit 210 may do not adjust the voltage and the operating frequency of the AP.

That is, in response to determining that the usage of the AP corresponding to the common function is within a predetermined range, the DVFS unit 210 may determine that both the processing performance and the power consumption maintain proper levels and do not adjust the voltage and the operating frequency of the AP.

Meanwhile, the execution of the common function includes both cases of execution in a background to drive the electronic device and execution according to the user manipulation. The DVFS unit 210 may measure the usage of the AP and adjust the voltage and the operating frequency of the AP based on the measured usage of the AP, in both cases.

Figure 9:
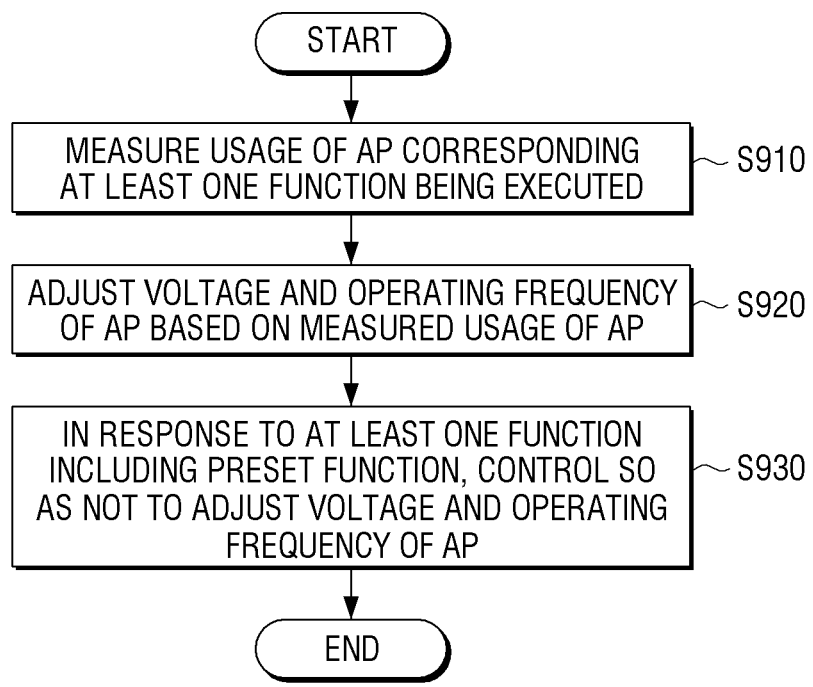
FIG. 9 is a flowchart provided to describe a method for controlling an electronic device according to an embodiment disclosed herein.

FIG. 9 is a flowchart provided to describe a method for controlling an electronic device according to an embodiment disclosed herein.

Referring to FIG. 9, a method of FIG. 9 includes measuring usage of an AP corresponding to at least one function being executed (S910).

Further, the method may include adjusting a voltage and an operating frequency of the AP based on the measured usage of the AP (S920).

The adjusting may include increasing the voltage and the operating frequency of the AP in response to the usage of the AP being higher than a predetermined upper threshold and decreasing the voltage and the operating frequency of the AP in response to the usage of the AP being lower than a predetermined lower threshold.

The adjusting may include not adjusting the voltage and the operating frequency of the AP in response to the usage of the AP being lower than the predetermined upper threshold and higher than the predetermined lower threshold.

In response to at least one function including a preset function, the method may include controlling so as not to adjust the voltage and the operating frequency of the AP (S930).

In response to the at least one function including the preset function, the controlling may include controlling so as not to adjust the voltage and the operating frequency of the AP based on a signal for avoiding adjustment of the voltage and the operating frequency of the AP.

The preset function may be a function set by default in a manufacturing process or selected by a user.

The preset function may be provided by a preset application. In response to the at least one function including the preset function, the controlling may include receiving the signal for avoiding adjustment of the voltage and the operating frequency of the AP from the preset application and controlling so as not to adjust the voltage and the operating frequency of the AP based on the received signal.

The method for controlling an electronic device according to an embodiment disclosed herein may further include determining a heating status and a battery status of the electronic device. In response to the at least one function including the preset function, the controlling may include controlling so as to adjust the voltage and the operating frequency of the AP based on the heating status and the battery status of the electronic device although the AP receives the signal for avoiding adjustment of the voltage and the operating frequency of the AP.

The AP may include a plurality of cores. In response to the at least one function including the preset function, the controlling may include controlling so as not to adjust a voltage and an operating frequency of a core where the preset function is executed and controlling so as to adjust voltages and operating frequencies of the other cores.

Further, a program for sequentially performing the operations of the method may be provided through a non-transitory computer readable medium.

For example, the program may perform the operations of measuring usage of an AP corresponding to at least one function being executed, adjusting a voltage and an operating frequency of the AP based on the measured usage of the AP, and in response to the at least one function including a preset function, controlling so as not to adjust the voltage and the operating frequency of the AP, and the program may be stored in and provided through the non-transitory computer readable medium.

The non-transitory computer readable medium refers to a machine-readable medium that stores data permanently or semi-permanently unlike a register, a cache, or a memory that stores data for a short time. Particularly, the above-described various applications and programs may be stored in and provided through the non-transitory computer readable medium, such as, a Compact Disc (CD), a Digital Versatile Disk (DVD), a hard disk, a Blu-ray disk, a Universal Serial Bus (USB), a memory card, a Read-Only Memory (ROM), or the like.

Meanwhile, the above block diagrams illustrating the electronic device do not show a bus, but communication between the components of the electronic device may be performed through the bus. The electronic device may further include a processor, such as, an Application Processor (AP) or a micro processor for performing the above-described various operations.

As above, a few embodiments have been shown and described. The foregoing embodiments and advantages are merely exemplary and are not to be construed as limiting the present inventive concept. The present teaching can be readily applied to other types of devices. Also, the description of the embodiments is intended to be illustrative, and not to limit the scope of the claims, and many alternatives, modifications, and variations will be apparent to those skilled in the art.

What is claimed is:

1. An electronic device comprising:
    a processor control unit configured to measure usage of a processor and adjust a voltage and an operating frequency of the processor based on the measured usage of the processor; and
    the processor configured to execute an application, and, in response to a preset signal being generated by the executed application, control the processor control unit to maintain the voltage and the operating frequency of the processor while the application is executed, wherein
    the processor includes a plurality of cores, and
    the processor control unit is configured to, based on the preset signal, maintain a voltage and an operating frequency of a core in which the preset signal is generated and adjust voltages and operating frequencies of the other cores.

2. The device as claimed in claim 1, wherein:
    the processor control unit is configured to determine a heating status and a battery status of the electronic device and adjust the voltage and the operating frequency of the processor based on the heating status and the battery status of the electronic device even when the preset signal is received.

3. The device as claimed in claim 1, wherein the processor control unit is configured to, based on the measured usage of the processor being higher than an upper threshold, increase the voltage and the operating frequency of the processor, and, based on the measured usage of the processor being lower than a lower threshold, decrease the voltage and the operating frequency of the processor.

4. The device as claimed in claim 3, wherein the processor control unit is configured to, based on the measured usage of the processor being lower than the upper threshold and higher than the lower threshold, maintain the voltage and the operating frequency of the processor.

5. The device as claimed in claim 1, wherein the preset signal is a signal set by default in a manufacturing process or selected by a user.

6. A method for controlling an electronic device, the method comprising:
    measuring usage of a processor;
    adjusting a voltage and an operating frequency of the processor based on the measured usage of the processor; and
    controlling, in response to a preset signal being generated by an application executed by the processor, to maintain the voltage and the operating frequency of the processor while the application is executed, wherein
    the processor includes a plurality of cores, and the method further comprises:
    based on the preset signal, maintaining a voltage and an operating frequency of a core in which the preset signal is generated and adjusting voltages and operating frequencies of the other cores.

7. The method as claimed in claim 6, further comprising:
    determining a heating status and a battery status of the electronic device, and
    adjusting the voltage and the operating frequency of the processor based on the heating status and the battery status of the electronic device even when the preset signal is received.

8. The method as claimed in claim 6, further comprising:
    based on the measured usage of the processor being higher than an upper threshold, increasing the voltage and the operating frequency of the processor, and
    based on the measured usage of the processor being lower than a lower threshold, decreasing the voltage and the operating frequency of the processor.

9. The method as claimed in claim 8, further comprising:
    based on the measured usage of the processor being lower than the upper threshold and higher than the lower threshold, maintaining the voltage and the operating frequency of the processor.

* * * * *